(12) United States Patent
Baars et al.

(10) Patent No.: US 8,921,904 B2
(45) Date of Patent: Dec. 30, 2014

(54) REPLACEMENT GATE FABRICATION METHODS

(71) Applicant: GLOBALFOUNDRIES, INC., Grand Cayman (KY)

(72) Inventors: Peter Baars, Dresden (DE); Matthias Goldbach, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/032,567

(22) Filed: Sep. 20, 2013

(65) Prior Publication Data

US 2014/0054714 A1 Feb. 27, 2014

Related U.S. Application Data

(62) Division of application No. 13/281,236, filed on Oct. 25, 2011, now Pat. No. 8,575,013.

(51) Int. Cl.
*H01L 21/28* (2006.01)
*H01L 27/088* (2006.01)
*H01L 29/66* (2006.01)
*H01L 29/78* (2006.01)

(52) U.S. Cl.
CPC ...... *H01L 27/0886* (2013.01); *H01L 29/66795* (2013.01); *H01L 29/785* (2013.01); *H01L 29/66545* (2013.01)
USPC .......................................... 257/288; 257/401

(58) Field of Classification Search
CPC ............................. H01L 29/772; H01L 21/28
USPC ....................... 257/288, E21.19, E29.24, 401
See application file for complete search history.

(56) References Cited

U.S. PATENT DOCUMENTS

| | | | | |
|---|---|---|---|---|
| 2005/0250285 | A1* | 11/2005 | Yoon et al. | 438/283 |
| 2006/0172497 | A1* | 8/2006 | Hareland et al. | 438/286 |
| 2007/0001237 | A1* | 1/2007 | King et al. | 257/401 |
| 2010/0308381 | A1* | 12/2010 | Luning et al. | 257/288 |
| 2011/0034020 | A1* | 2/2011 | Johnson | 438/595 |

OTHER PUBLICATIONS

U.S. Notice of Allowance mailed Jun. 26, 2013 in U.S. Appl. No. 13/281,326.

* cited by examiner

*Primary Examiner* — Asok K Sarkar
*Assistant Examiner* — Dmitriy Yemelyanov
(74) *Attorney, Agent, or Firm* — Ingrassia Fisher & Lorenz, P.C.

(57) ABSTRACT

Semiconductor devices and related fabrication methods are provided. An exemplary fabrication method involves forming a pair of gate structures having a dielectric region disposed between a first gate structure of the pair and a second gate structure of the pair, and forming a voided region in the dielectric region between the first gate structure and the second gate structure. The first and second gate structures each include a first gate electrode material, wherein the method continues by removing the first gate electrode material to provide second and third voided regions corresponding to the gate structures and forming a second gate electrode material in the first voided region, the second voided region, and the third voided region.

11 Claims, 7 Drawing Sheets

REPLACEMENT GATE FABRICATION METHODS

CROSS-REFERENCE TO RELATED APPLICATION

This is a divisional application of U.S. patent application Ser. No. 13/281,236, filed Oct. 25, 2011.

TECHNICAL FIELD

Embodiments of the subject matter generally relate to semiconductor device structures and related fabrication methods, and more particularly, embodiments of the subject matter relate to replacement gate fabrication methods for semiconductor devices.

BACKGROUND

Transistors, such as metal oxide semiconductor field-effect transistors (MOSFETs), are the core building block of the vast majority of semiconductor devices. Decreasing transistors size, and thus increasing transistor density, has traditionally been a high priority in the semiconductor manufacturing industry. At the same time, it is desirable to accurately and precisely fabricate transistors and other semiconductor devices with physical features having their intended physical dimensions, to thereby achieve semiconductor devices having their intended performance characteristics and improve yield. However, as device geometries decrease, the physical limitations of existing fabrication processes may result in device features that deviate from their intended physical dimensions, which, in turn, may lead to failures at wafer test and/or reduce yield.

BRIEF SUMMARY

A method is provided for fabricating a semiconductor device structure. The method involves forming a pair of gate structures having a dielectric region disposed between a first gate structure of the pair and a second gate structure of the pair, and forming a voided region in the dielectric region between the first gate structure and the second gate structure. The first and second gate structures each include a first gate electrode material, wherein the method continues by removing the first gate electrode material to provide second and third voided regions corresponding to the gate structures and forming a second gate electrode material in the first voided region, the second voided region, and the third voided region.

In another embodiment, a method of fabricating a semiconductor device structure involves forming a first gate structure composed of a dummy gate electrode material and having a first longitudinal axis aligned in a first direction, forming a second gate structure composed of the dummy gate electrode material and having a second longitudinal axis substantially aligned in the first direction, forming a dielectric region between the first gate structure and the second gate structure, etching the dielectric region to form a first voided region in the dielectric region between the first gate structure and the second gate structure, removing the dummy gate electrode material to provide a second voided region corresponding to the first gate structure and a third voided region corresponding to the second gate structure, and forming a replacement gate electrode material in the first voided region, the second voided region, and the third voided region. In an exemplary embodiment, the replacement gate electrode material formed in the first voided region is contiguous with the replacement gate electrode material formed in the second and third voided regions.

In yet another embodiment, a method of fabricating a semiconductor device structure involves forming parallel gate structures of a dummy gate material having a dielectric region disposed between the parallel gate structures, forming a masking material overlying the dielectric region and the parallel gate structures, forming an opening in the masking material to expose a portion of the dielectric region between the parallel gate structures, anisotropically etching the portion of the dielectric region using the masking material as an etch mask to form a first voided region within the dielectric region corresponding to the opening, removing the masking material, removing the dummy gate material to provide voided regions corresponding to the parallel gate structures that are contiguous with the voided region within the dielectric region, and forming a metal material in the voided regions corresponding to the parallel gate structures and the voided region within the dielectric region.

In another embodiment, an apparatus for a semiconductor device is provided. The semiconductor device includes a semiconductor substrate and a gate structure overlying the semiconductor substrate. The gate structure includes parallel gate portions of a conductive gate electrode material and an interconnecting portion of the conductive gate electrode material, wherein the interconnecting portion is contiguous with the parallel gate portions. A first dielectric material is disposed between the parallel gate portions, wherein at least a portion of the first dielectric material contacts at least a portion of the interconnecting portion. A second dielectric material is disposed between the parallel gate portions and the first dielectric material.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

FIGS. 1-14 illustrate a semiconductor device structure 100 and related process steps for fabricating the semiconductor device structure 100. In the illustrated embodiment, the semiconductor device structure 100 is a FinFET that includes one or more conductive (or semiconductive) fins extending between source and drain regions. However, it should be noted that although the subject matter is described herein in the context of a FinFET semiconductor device, the subject matter is not intended to be limited to FinFET semiconductor devices, and may be utilized with planar MOSFET semiconductor devices or other semiconductor devices which are not FinFET semiconductor devices. A variety of FinFET devices and related fabrication processes are known, and so, in the interest of brevity, many conventional steps will only be mentioned briefly herein or will be omitted entirely without providing the well known process details.

Figure 1:
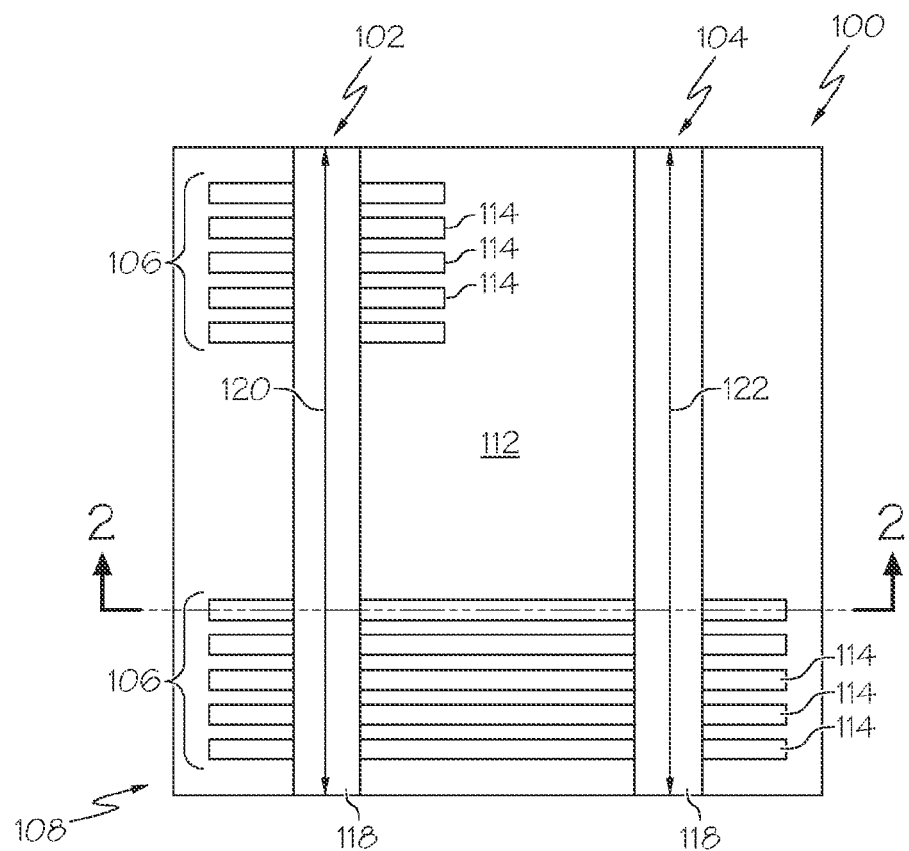
FIGS. 1-14 are cross-sectional views and top views that illustrate a semiconductor device structure and methods for fabricating the semiconductor device structure in exemplary embodiments.
Figure 2:
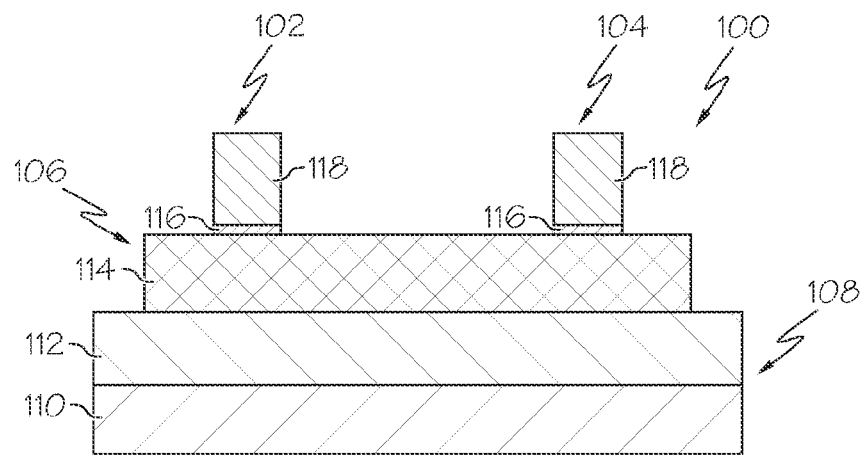

Referring to FIGS. 1-2, in an exemplary embodiment, the fabrication of the semiconductor device structure 100 begins by forming a plurality of gate structures 102, 104 overlying fins 106 formed on a semiconductor substrate 108. FIG. 1 depicts a top view of the semiconductor device structure 100 and FIG. 2 depicts a cross-sectional view of the semiconductor device structure 100 of FIG. 1 along the line 2-2. In an exemplary embodiment, the gate structures 102, 104 are dummy gates that are subsequently replaced as described in greater detail below.

In the illustrated embodiment, the semiconductor substrate 108 is realized as a silicon-on-insulator (SOI) substrate having a support layer 110, a layer of insulating material 112 on the support layer 110, and a layer of semiconductor material 114 on the layer of insulating material 112. The insulating material 112 is preferably realized as an oxide layer formed in a subsurface region of the semiconductor substrate, also known as a buried oxide (BOX) layer, and for convenience, the insulating material 112 may alternatively be referred to herein as an oxide material. The semiconductor material 114 is preferably a silicon material, wherein the term "silicon material" is used herein to encompass the relatively pure silicon materials typically used in the semiconductor industry as well as silicon admixed with other elements such as germanium, carbon, and the like. In alternative embodiments, the semiconductor material 114 can be germanium, gallium arsenide, or the like. The fins 106 may be formed from the semiconductor material 114 by forming an etch mask that defines, overlies, or otherwise protects the fins 106 and anisotropically etching the exposed portions of semiconductor material 114 to expose the underlying oxide material 112 between and/or around the fins 106. As best illustrated in FIG. 1, in an exemplary embodiment, the fins 106 are arranged substantially parallel to one another, or in other words, the longitudinal axes of the fins 106 are aligned in the same direction. In an exemplary embodiment, the fins 106 are doped (e.g., by implanting dopant ions) to form an N-type region (or N-well) or a P-type region (or P-well) for the channel of a subsequently formed transistors, as will be appreciated in the art. It should be understood that the fabrication process described herein is not constrained by the number of fins 106, the dimensions of the fins 106, or the manner in which the fins 106 are formed. Furthermore, as noted above, the fabrication process is not intended to be limited to FinFET devices and may be employed in an equivalent manner to fabricate planar transistor devices. Additionally, in alternative embodiments, the semiconductor substrate 108 may be realized as a bulk semiconductor substrate (e.g., a bulk silicon substrate) rather than a SOI substrate as described herein.

Still referring to FIGS. 1-2, in an exemplary embodiment, the dummy gate structures 102, 104 are formed by forming one or more layers of dielectric material 116, such as an oxide material, overlying the semiconductor material 114, and forming one or more layers of a dummy gate electrode material 118, such as a polycrystalline silicon (polysilicon) material, overlying the layer(s) of dielectric material 116. In one embodiment, to form the dummy gate structures 102, 104, an oxide material 116 is grown or deposited on the semiconductor material 114 and a polysilicon material 118 is conformably deposited overlying the semiconductor substrate 108. After depositing the dummy gate electrode material 118, an etch mask is formed overlying the dummy gate electrode material 118 and patterned to define, overlie, or otherwise protect portions of the dummy gate electrode material 118 corresponding to the dummy gate structures 102, 104, and the exposed portions of the gate materials 116, 118 are anisotropically etched to form the gate structures 102, 104. For convenience, but without limitation, the dielectric material 116 may alternatively be referred to herein as an oxide material and the dummy gate electrode material 118 may alternatively be referred to herein as a polysilicon material.

As best illustrated in FIG. 1, the dummy gate structures 102, 104 are aligned substantially parallel to one another and substantially perpendicular to the fins 106. In this regard, the longitudinal axis 120 of the first dummy gate structure 102 is aligned in a first direction substantially perpendicular to the longitudinal axes of the fins 106, and the longitudinal axis 122 of the second dummy gate structure 104 is aligned substantially parallel to the longitudinal axis 120 of the first dummy gate structure 102 (e.g., in the same direction as longitudinal axis 120) and substantially perpendicular to the longitudinal axes of the fins 106. Thus, there is no connection between the dummy gate structures 102 in the dummy gate electrode material 118. It should be noted that although FIG. 1 depicts a pair of parallel dummy gate structures 102, 104, it should be understood that the fabrication process described herein is not limited to any particular number of dummy gate structures 102, 104.

Figure 3:
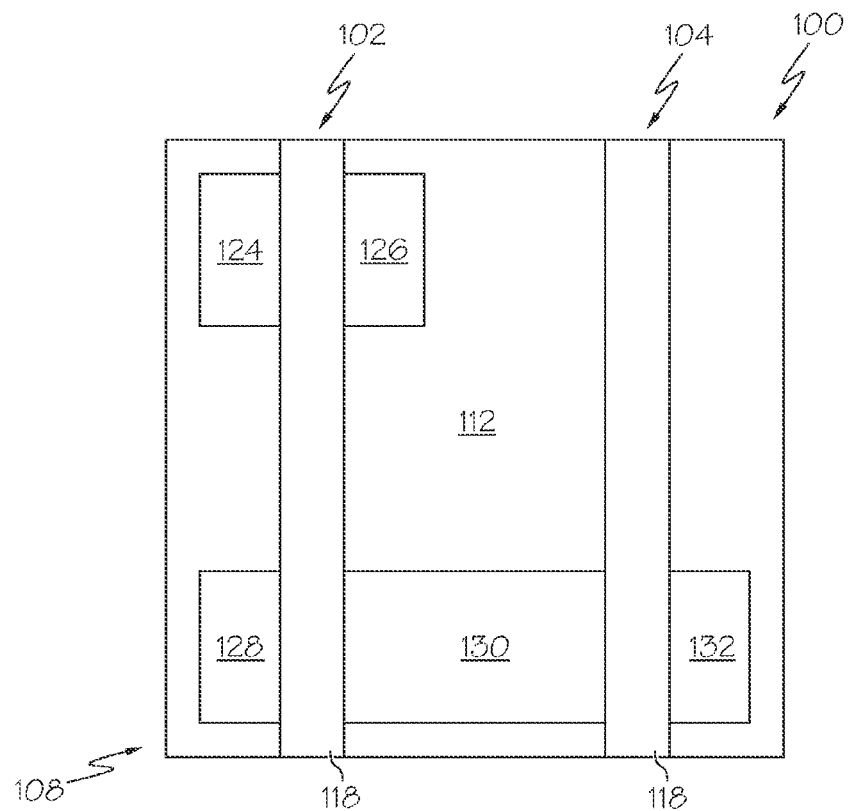

Turning now to FIG. 3, after the dummy gate structures 102, 104 are formed, the fabrication of FinFET transistor devices on the substrate 108 continues by forming regions 124, 126, 128, 130, 132 of semiconductor material that provide electrical connections between adjacent fins 106 and function as soured/train regions for the FinFET transistor devices. In accordance with one embodiment, a spacer (not illustrated) is formed about the dummy gate structures 102, 104 the regions 124, 126, 128, 130, 132 of semiconductor material are formed by epitaxially growing a semiconductor material on exposed surfaces of the semiconductor material 114 and/or fins 106, wherein the spacer acts as a mask (i.e., selective epitaxy) preventing any epitaxial growth on the surface of the masked portions of the fins 106 and/or the dummy gate structures 102, 104. Preferably, the epitaxially grown semiconductor material is grown to a thickness such that the semiconductor material fills the gaps between adjacent fins 106 and provides electrical connections across adjacent fins 106. In an exemplary embodiment, the regions 124, 126, 128, 130, 132 are doped (e.g., by implanting dopant ions of a conductivity-determining impurity type opposite the doping of the channel portion of the fins 106 underlying the dummy gate structures 102, 104) to create the source and drain regions for the semiconductor device structure 100. It should be understood that the fabrication process described herein is not constrained by the number of source/drain regions 124, 126, 128, 130, 132 or the manner in which the source/drain regions 124, 126, 128, 130, 132 are formed.

Figure 4:
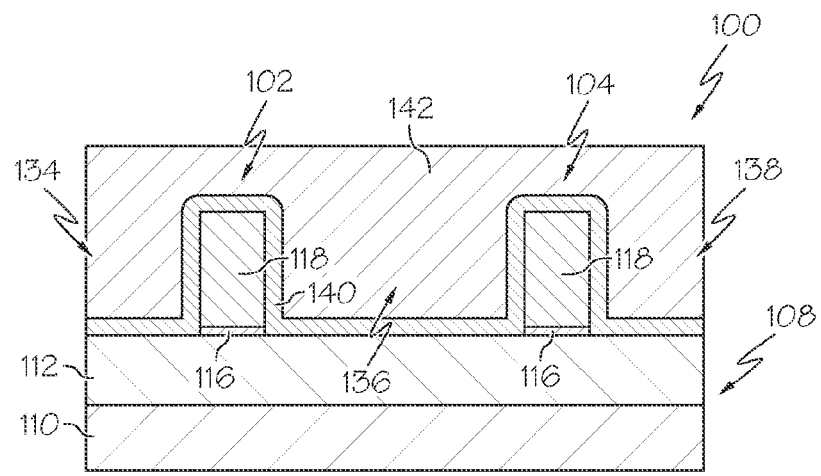
Figure 5:
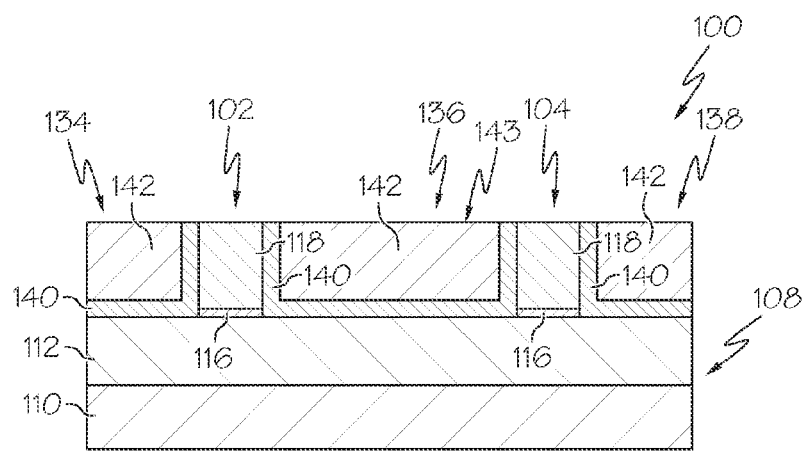
Figure 6:
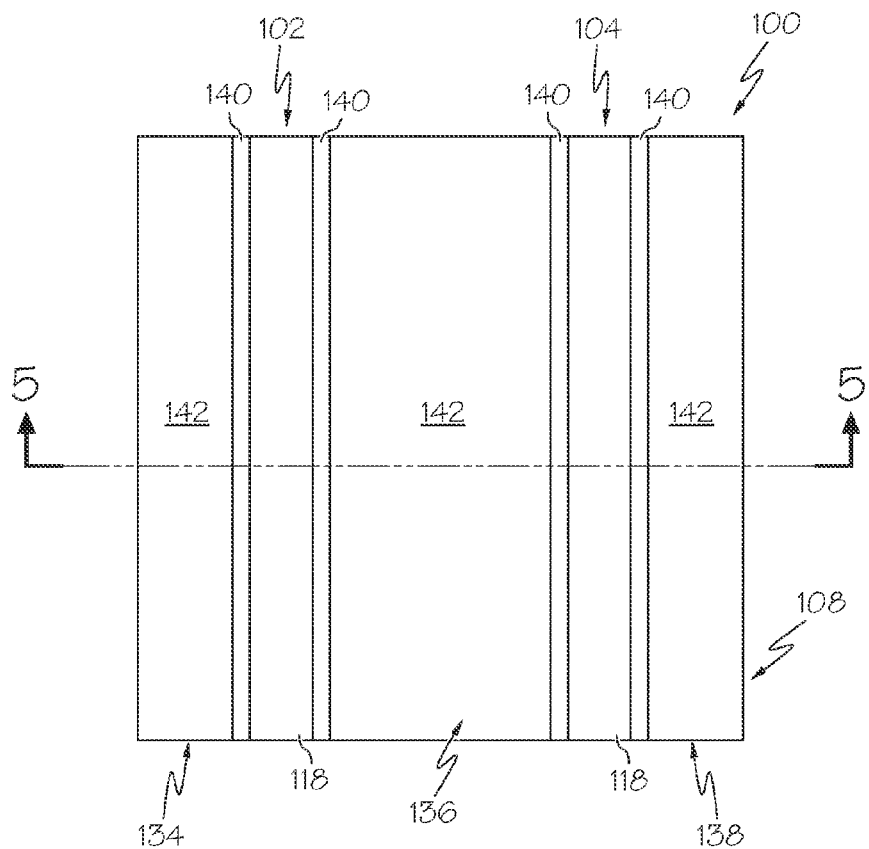

Referring to FIGS. 4-6, in an exemplary embodiment, the fabrication process continues by forming dielectric regions 134, 136, 138 composed of one or more dielectric materials 140, 142 between the dummy gate structures 102, 104. As best illustrated in FIGS. 4-5, in an exemplary embodiment, the dielectric regions 134, 136, 138 are formed by forming a layer of a first dielectric material 140 overlying the substrate 108 and forming a layer of a second dielectric material 142 overlying the first dielectric material 140. In an exemplary embodiment, the first layer of dielectric material 140 is preferably realized as a layer of a nitride material, such as silicon nitride, that is conformably deposited overlying the semiconductor device structure 100 of FIG. 3 to a thickness ranging from about 3 nm to about 50 nm, for example, by chemical vapor deposition (CVD), atomic layer deposition (ALD) or another deposition process. The second dielectric material 142 is preferably realized as a layer of an oxide material, such as silicon dioxide, that is conformably deposited overlying the layer of nitride material 140 to a thickness chosen such that the oxide material 142 fills any gaps between the dummy gate structures 102, 104 to a minimum height that meets or exceeds the height of the dummy gate structures 102, 104. In other words, the thickness of the oxide material 142 is greater than or equal to the difference between the height of the dummy gate structures 102, 104 and the thickness of the layer of nitride material 140. For example, the layer of silicon dioxide 142 may be formed to a thickness between about 10 nm to about 800 nm, and preferably around 400 nm, by tetraethyl orthosilicate (TEOS) CVD or another deposition process to ensure the gaps between the dummy gate structures 102, 104 are completely filled to a height above the dummy gate structures 102, 104.

After forming the dielectric materials 140, 142, the fabrication process continues by removing portions of the dielectric materials 140, 142 to obtain a substantially planar surface 143 that is aligned with the upper surface of the dummy gate structures 102, 104, resulting in the semiconductor device structure 100 illustrated in FIGS. 5-6. In this regard, FIG. 6 depicts a top view of the semiconductor device structure 100 after planarizing the dielectric materials 140, 142 and FIG. 5 depicts a cross-sectional view of the semiconductor device structure 100 of FIG. 6 along the line 5-5. In an exemplary embodiment, the fabrication process planarizes the dielectric materials 140, 142 to uniformly remove portions of the dielectric materials 140, 142 across the semiconductor substrate 108 until reaching the dummy gate electrode material 118. In other words, the fabrication process ceases planarizing the dielectric materials 140, 142 when the dummy gate electrode material 118 is exposed. In accordance with one embodiment, chemical-mechanical planarization (CMP) is used to polish the dielectric materials 140, 142 with a chemical slurry for a predetermined amount of time based on the thicknesses of the dielectric materials 140, 142 such that the CMP stops when the upper surfaces of the dummy gate electrode material 118 are exposed. Alternative endpoint detection techniques could also be utilized to determine when to stop the CMP procedure, or alternative planarization techniques may be used to obtain a substantially planar surface that is aligned with the upper surfaces of the dummy gate structures 102, 104.

Figure 7:
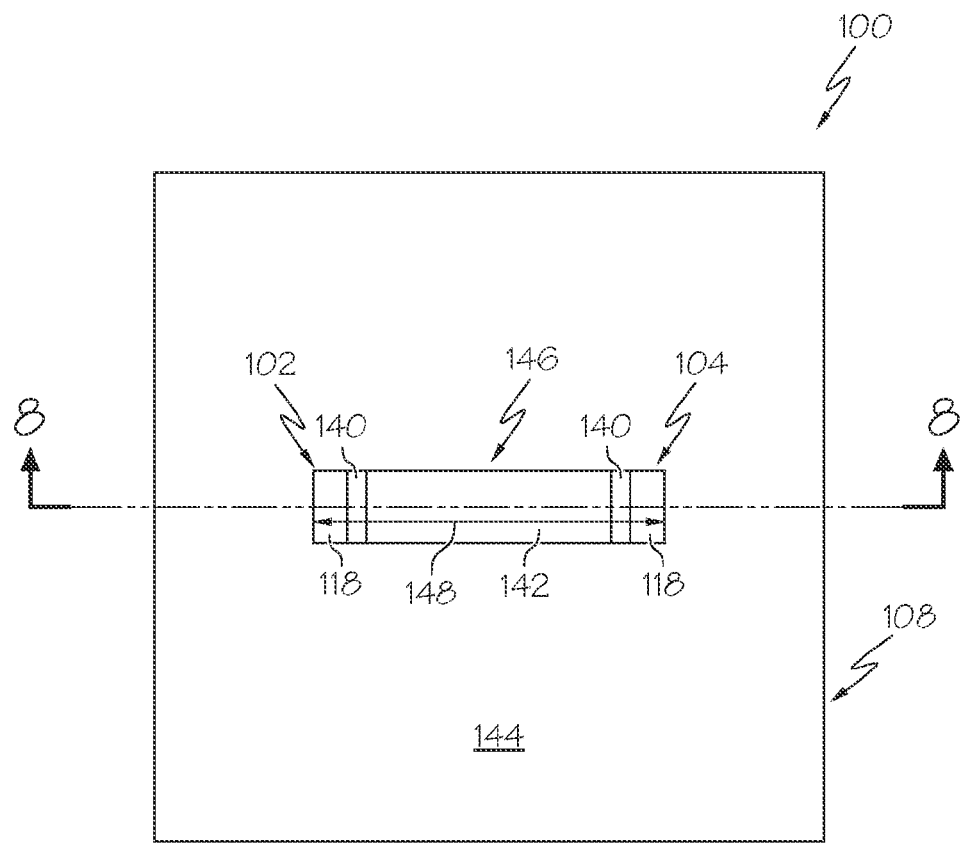
Figure 8:
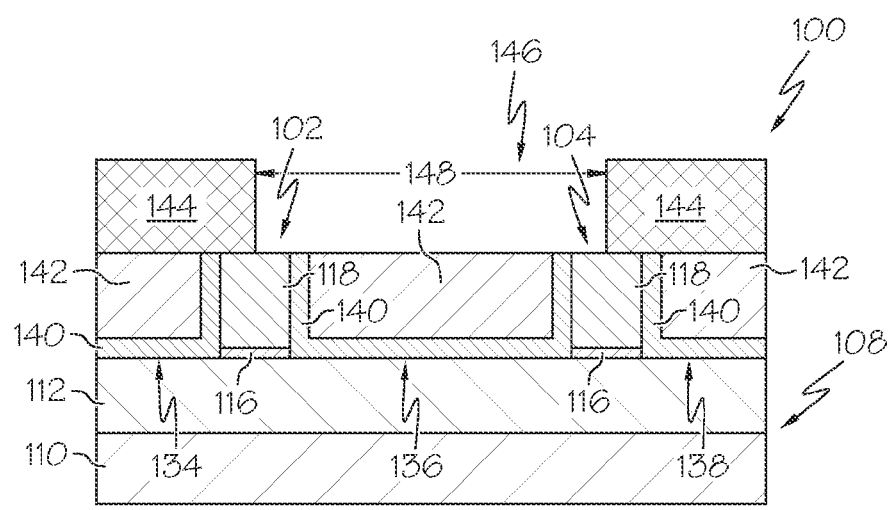

Referring now to FIGS. 7-8, the fabrication process continues by forming one or more layers of a masking material 144, such as a photoresist material, overlying the semiconductor device structure 100 of FIGS. 5-6 and forming an opening 146 in the masking material 144 that exposes a portion of the dielectric region 136 between the dummy gate structures 102, 104. In this regard, FIG. 7 depicts a top view of the semiconductor device structure 100 after forming the opening 146 in the masking material 144 and FIG. 8 depicts a cross-sectional view of the semiconductor device structure 100 of FIG. 7 along the line 8-8. In accordance with one embodiment, the masking material 144 is conformably deposited or otherwise applied overlying the substrate 108 and patterned to using conventional photolithography process steps to form an etch mask that includes the opening 146. It should be noted that although FIG. 7 depicts the masking material 144 as a unitary material, in practice, the masking material may include one or more layers of material. For example, in an alternative embodiment, the masking material 144 is realized as a tri-layer mask that includes an antireflective silicon oxynitride layer underlying a hard mask material layer (e.g., a carbon hard mask or the like), with a photoresist material overlying the hard mask material layer.

As illustrated in FIGS. 7-8, the opening 146 is substantially linear and extends along a longitudinal axis 148 between the dummy gate structures 102, 104. In an exemplary embodiment, the end portions (or ends) of the opening 146 corresponding to the endpoints of the longitudinal axis 148 overlap or otherwise overlie at least a portion of the dummy gate structures 102, 104. For example, a first end of the opening 146 overlaps and/or overlies at least a portion of the dummy gate electrode material 118 of the first dummy gate structure 102 and the second end of the opening 146 opposite the first end along the longitudinal axis 148 of the opening 146 overlaps and/or overlies at least a portion of the dummy gate electrode material 118 of the second dummy gate structure 104. In this regard, the length of the opening 146 along the longitudinal axis 148 is greater than the distance between the dummy gate structures 102, 104, that is, the length of the opening 146 is greater than the width of the dielectric region 136. In the illustrated embodiment of FIGS. 7-8, the longitudinal axis 148 of the opening 146 is substantially perpendicular to the longitudinal axes of the dummy gate structures 102, 104 (e.g., axes 120, 122), however, in alternative embodiments, the longitudinal axis 148 of the opening 146 may be oblique (or diagonal) to the longitudinal axes of the dummy gate structures 102, 104. As a result of the opening 146 being substantially linear and overlapping the dummy gate structures 102, 104, the interior portions of the longitudinal edges of the opening 146 that overlie the dielectric region 136 are straight. Thus, while the ends of the opening 146 overlying the dummy gate structures 102, 104 may become rounded at smaller device geometries by virtue of the photolithography process steps, the edges of the opening 146 overlying the dielectric region 136 may remain straight and substantially free of rounding or other imperfections and/or deformities attributable to the photolithography process steps.

Figure 9:
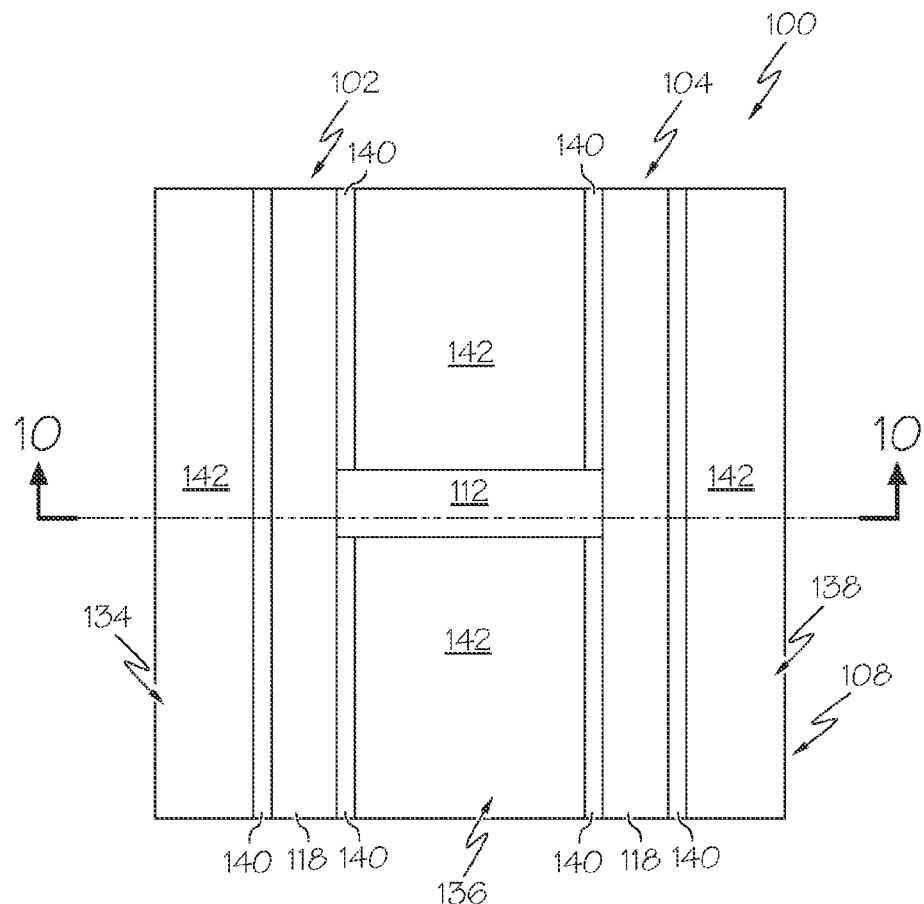
Figure 10:
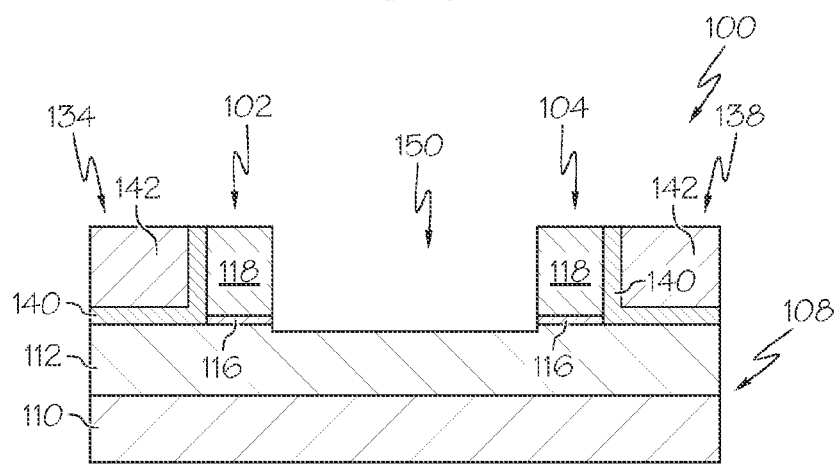

Referring now to FIGS. 9-10, after patterning the masking material 144 to provide the substantially linear opening 146 extending between the dummy gate structures 102, 104, the fabrication process continues by selectively removing the exposed portion of the dielectric region 136 between the dummy gate structures 102, 104 using the masking material 144 as an etch mask to form a voided region 150 within the dielectric region 136 between the dummy gate structures 102, 104. In this regard, FIG. 9 depicts a top view of the semiconductor device structure 100 after forming the voided region 150 between the dummy gate structures 102, 104 and FIG. 8 depicts a cross-sectional view of the semiconductor device structure 100 of FIG. 9 along the line 10-10. In an exemplary embodiment, the exposed portion of the dielectric region 136 is removed by anisotropically etching the dielectric materials 140, 142 concurrently, for example, by plasma-based reactive ion etching (RIE) using an anisotropic etchant with an applied bias voltage to anisotropically etch the dielectric materials 140, 142 and expose the underlying material 112 with good selectivity to the dummy gate electrode material 118 to form the voided region 150. The anisotropic etching of the dielectric materials 140, 142 may partially etch the portion of the material 112 between the gate structures 102, 104 that is exposed by the opening 146 and voided region 150, as depicted in FIG. 10 (e.g., the oxide material 112 underlying the voided region 150 is thinner than the adjacent oxide material 112 underlying the dummy gate structures 102, 104). After removing the exposed portion of the dielectric region 136, any remaining masking material 144 is removed in a conventional manner resulting in the semiconductor device structure 100 depicted in FIGS. 9-10. As illustrated, by virtue of the opening 146 overlapping the dummy gate structures 102, 104, the voided region 150 contacts or is otherwise contiguous with the exposed portions of the dummy gate electrode material 118 of the dummy gate structures 102, 104.

Figure 11:
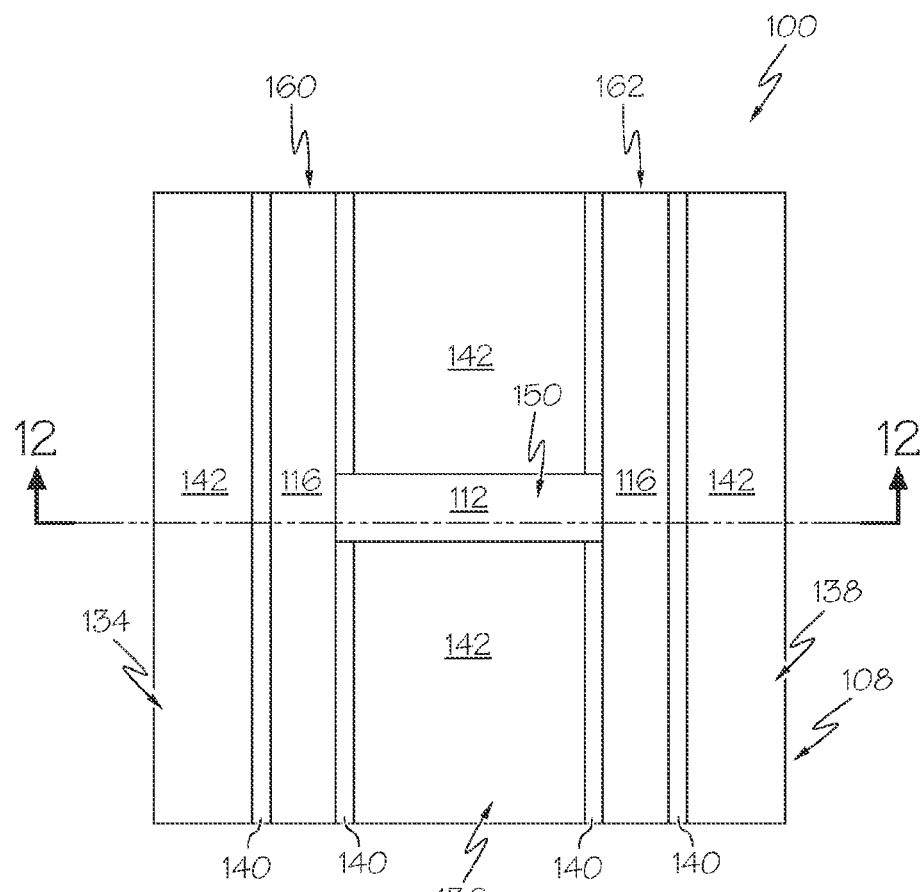
Figure 12:
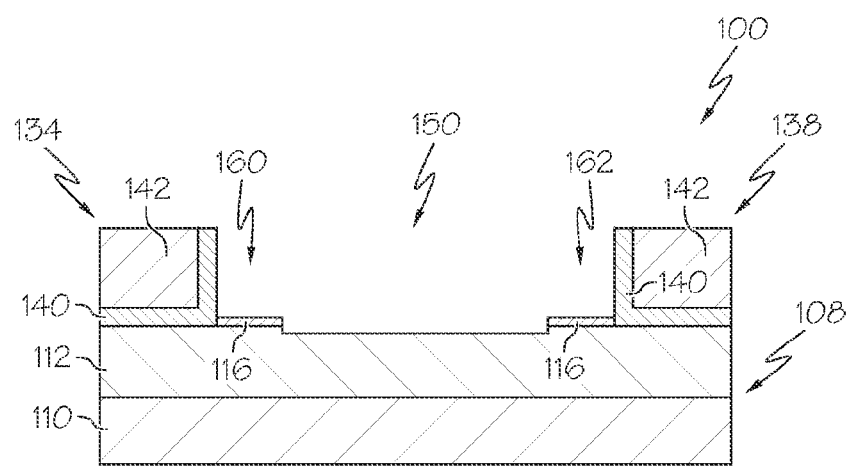

Turning now to FIGS. 11-12, in an exemplary embodiment, the fabrication process continues by removing the dummy gate electrode material 118 to form voided regions 160, 162 corresponding to the dummy gate structures 102, 104. In this regard, FIG. 11 depicts a top view of the semiconductor device structure 100 after removing the dummy gate electrode material 118 and FIG. 12 depicts a cross-sectional view of the semiconductor device structure 100 of FIG. 11 along the line 12-12. In accordance with one exemplary embodiment, when the dummy gate electrode material 118 is realized as a polysilicon material 118, the polysilicon material 118 is removed by plasma-based RIE using an anisotropic etchant with an applied bias voltage to anisotropically etch the polysilicon material 118 and expose the underlying dielectric material 116 with good selectivity to the dielectric materials 112, 116, 140, 142 (e.g., selective to oxide materials 112, 116, 142 and nitride material 140). As illustrated, removal of the dummy gate electrode material 118 creates a first voided region 160 between dielectric regions 134, 136 corresponding to the first dummy gate structure 102 and a second voided region 162 between dielectric regions 136, 138 corresponding to the second dummy gate structure 104. As best illustrated in FIG. 12, the voided regions 160, 162 corresponding to the dummy gate structures 102, 104 are contiguous with the voided region 150 to provide a continuous voided region within the dielectric regions 134, 136, 138 that defines a subsequently formed replacement gate structure. It should be noted that in some alternative embodiments, the fabrication process may continue by removing the dummy gate dielectric material 116 after (or contemporaneously to) removing the dummy gate electrode material 118.

Figure 13:
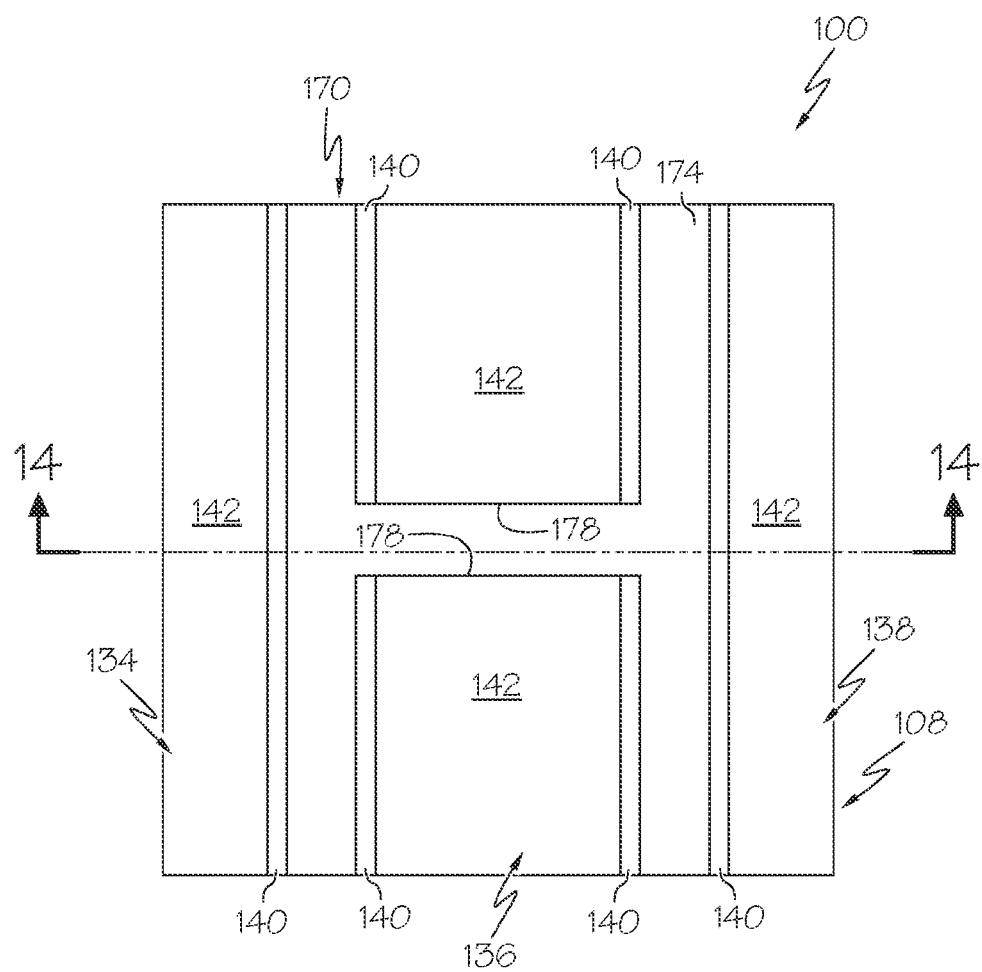
Figure 14:
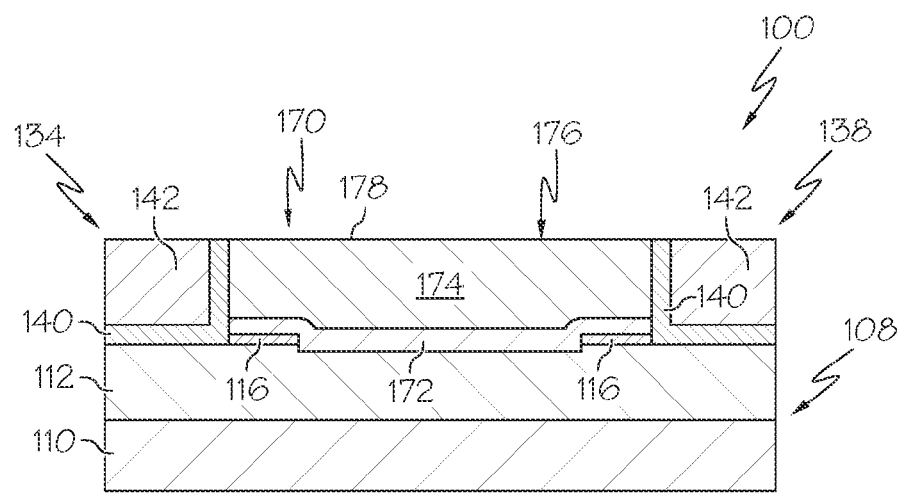

Referring now to FIGS. 13-14, in an exemplary embodiment, the fabrication process continues by forming a replacement gate structure 170 in the voided regions 150, 160, 162 within the dielectric regions 134, 136, 138. In this regard, FIG. 13 depicts a top view of the semiconductor device structure 100 after forming the replacement gate structure 170 and FIG. 14 depicts a cross-sectional view of the semiconductor device structure 100 of FIG. 13 along the line 14-14. The replacement gate structure 170 function as the gate electrode for the FinFET transistor structures formed on the semiconductor substrate 108, and preferably includes at least one layer of gate dielectric material and at least one layer of conductive gate electrode material. In an exemplary embodiment, the replacement gate structure 170 is realized as a high-k metal gate that is formed by forming a layer of a high-k dielectric material 172 in the voided regions 150, 160, 162 and forming one or more layers conductive metal material 174 overlying the high-k dielectric material 172. In accordance with one embodiment, the layer of high-k dielectric material 172 is formed by conformably depositing a layer of a material having a dielectric constant greater than silicon dioxide overlying the substrate 108, such as hafnium silicate, hafnium oxide, hafnium silicon oxynitride, hafnium oxynitride, or another high-k dielectric. After conformably depositing the layer of high-k dielectric material 172, the layer of conductive metal material 174 is formed by conformably depositing a metal material 174, such as titanium nitride, titanium aluminum, tungsten, or another metal material, overlying the high-k dielectric material 172 to a thickness chosen such that the metal material 174 fills the voided regions 150, 160, 162 to a minimum height that meets or exceeds the height of the dielectric regions 134, 136, 138. It will be appreciated that there are numerous combinations of dielectric materials and conductive materials that may be utilized in a practical embodiment of the replacement gate 170, and the subject matter described herein is not limited to the number, type, and/or thickness of replacement materials in the replacement gate 170, which will vary depending on the desired work function for the replacement gate 170.

After forming the replacement gate materials 172, 174, the fabrication process continues by planarizing the replacement gate materials 172, 174 until reaching the dielectric materials 140, 142 and/or dielectric regions 134, 136, 138 to obtain a substantially planar surface 176 that is aligned with the upper surface of the dielectric materials 140, 142 of the dielectric regions 134, 136, 138, resulting in the semiconductor device structure 100 illustrated in FIGS. 13-14. For example, CMP may be used to polish the replacement gate materials 172, 174 with a chemical slurry for a predetermined amount of time based on the thicknesses of the replacement gate materials 172, 174 such that the CMP stops when the upper surfaces of the dielectric regions 134, 136, 138 and/or dielectric materials 140, 142 are exposed. After forming the replacement gate structure 170, fabrication of the semiconductor device structure 100 may be completed using well known final process steps (e.g., back end of line (BEOL) process steps), which will not be described in detail herein.

Still referring to FIGS. 13-14, by virtue of the voided regions 150, 160, 162 being contiguous and/or continuous, the metal material 174 filling the voided regions 150, 160, 162 is substantially continuous throughout the replacement gate structure 170 to provide parallel gate portions of metal material 174 corresponding to the dummy gate structures 102, 104 that are contiguous and/or continuous with an interconnecting portion of the metal material 174. As best illustrated in FIG. 13, with reference to FIGS. 11-12, the interconnecting portion of the replacement gate structure 170 is composed of the metal material 174 that fills the voided region 150 between voided regions 160, 162, and the interconnecting portion provides an electrical interconnection between the parallel gate portions of the replacement gate structure 170, which are perpendicular to the longitudinal axes of the underlying fins 106 and occupy the voided regions 160, 162 corresponding to the dummy gate structures 102, 104. In this regard, the longitudinal axis of the interconnecting portion (which corresponds to the longitudinal axis of the voided region 150 and is aligned in substantially the same direction as longitudinal axis 148) is not parallel to the longitudinal axes of the parallel gate portions (which correspond to longitudinal axes 120, 122). As illustrated in FIG. 13, the metal material 174 of the interconnecting portion (e.g., the central or interior metal material 174 along the longitudinal edges 178) contacts the oxide material 142. Additionally, the longitudinal edges 178 of the interconnecting portion of replacement gate structure 170 occupying the voided region 150 are substantially straight and the corners are substantially free of rounding at the locations where the interconnecting portion of the replacement gate structure 170 occupying the voided region 150 intersects and/or meets the portions of the replacement gate structure 170 occupying the voided regions 160, 162. As illustrated in FIGS. 13-14, the parallel gate portions of metal material 174 corresponding to the dummy gate structures 102, 104 do not contact the oxide material 142 and are separated from the oxide material 142 by the remaining portions of the spacer material 140 that was previously formed about the dummy gate structures 102, 104, and the longitudinal axes of the parallel gate portions are aligned perpendicular to the longitudinal axes of the plurality of fins 106 as set forth above with respect to the dummy gate structures 102, 104.

To briefly summarize, one advantage of the fabrication process described herein is that the gates of the multi-gate FinFET device are electrically interconnected at the gate level rather than an overlying metal layer (e.g., metal layer 1) while maintaining substantially straight edges and corners at the intersections of gate materials as device geometries are reduced, as compared to traditional fabrication processes which are prone to rounding at the intersections of the gate materials at smaller device geometries, which may introduce component variation and reduce yield and/or require electrical interconnections between gates be made in an overlying metal layer (e.g., metal layer 1).

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
    a semiconductor substrate; and
    a gate structure overlying the semiconductor substrate, wherein the gate structure includes:
        a first gate portion of a conductive gate electrode material and a second gate portion of the conductive gate electrode material; and
        an interconnecting portion of the conductive gate electrode material, wherein the interconnecting portion is contiguous with the first gate portion and the second gate portion;
    a first dielectric material disposed between the first gate portion and the second gate portion; and
    a second dielectric material disposed between the first gate portion and the first dielectric material and between the second gate portion and the first dielectric material wherein at least a portion of the first dielectric material directly contacts at least a portion of the interconnecting portion; wherein:
        the second dielectric material includes a first portion that extends longitudinally from the first gate portion toward the second gate portion and a second portion that extends longitudinally from the second gate portion toward the first gate portion;
        the first portion of the second dielectric material directly contacts the interconnecting portion;
        the second portion of the second dielectric material directly contacts the interconnecting portion; and
        the first dielectric material directly contacts the interconnecting portion between the first portion of the second dielectric material and the second portion of the second dielectric material.

2. The semiconductor device of claim 1, further comprising a plurality of fins of a semiconductor material overlying the semiconductor substrate having longitudinal axes aligned in a first direction, wherein the first gate portion and the second gate portion each include:
    a first portion of the conductive gate electrode material overlying at least one fin of the plurality of fins, the first portion having a longitudinal axis aligned perpendicular to the longitudinal axes of the plurality of fins; and
    a second portion of the conductive gate electrode material overlying at least one fin of the plurality of fins, wherein a longitudinal axis of the second portion is parallel to the longitudinal axis of the first portion.

3. The semiconductor device of claim 1 wherein the first gate portion, the second gate portion, and the interconnecting portion are integral.

4. The semiconductor device of claim 1 wherein the first gate portion, the second gate portion, and the interconnecting portion have a continuous planar upper surface.

5. The semiconductor device of claim 1 wherein the second dielectric material completely separates the first gate portion from contact with the first dielectric material and the second gate portion from contact with the first dielectric material.

6. The semiconductor device of claim 1 wherein the first gate portion and the second gate portion are parallel.

7. The semiconductor device of claim 1 wherein:
    the insulator layer includes a recessed portion and a non-recessed portion;
    the first gate portion of the conductive gate electrode material and the second gate portion of the conductive gate electrode material lie over the non-recessed portion of insulator layer; and
    the interconnecting portion of the conductive gate electrode material lies over the recessed portion of the insulator layer.

8. The semiconductor device of claim 1 wherein the first gate portion and the interconnecting portion are perpendicular and join at first corners, wherein each first corner has a substantially straight edge.

9. The semiconductor device of claim 8 wherein the second gate portion and the interconnecting portion are perpendicular and join at second corners, wherein each second corner has a substantially straight edge.

10. The semiconductor device of claim 9 wherein the second dielectric material is in contact with each first corner and each second corner.

11. A semiconductor device comprising:
    a semiconductor substrate, wherein the semiconductor substrate includes an insulator layer overlying a support layer, wherein the insulator layer includes a recessed portion and a non-recessed portion;
    a gate structure overlying the semiconductor substrate, wherein the gate structure includes:
        a first gate portion of a conductive gate electrode material and a second gate portion of the conductive gate electrode material, wherein the first gate portion and the second gate portion lie over the non-recessed portion of insulator layer;
        an interconnecting portion of the conductive gate electrode material, wherein the interconnecting portion is contiguous with the first gate portion and the second gate portion and wherein the interconnecting portion lies over the recessed portion of the insulator layer dielectric material disposed between the first gate portion and the second gate portion and comprising:
  a first dielectric material disposed between the first gate portion and the second gate portion and directly contacting a portion of the interconnecting portion; and
  a second dielectric material disposed between the first gate portion and the first dielectric material and between the second gate portion and the first dielectric material and directly contacting a portion of the interconnecting portion, wherein the second dielectric material includes a first portion that extends longitudinally from the first gate portion toward the second gate portion and a second portion that extends longitudinally from the second gate portion toward the first gate portion, and wherein the first dielectric material directly contacts the interconnecting portion between the first portion of the second dielectric material and the second portion of the second dielectric material.

* * * * *